United States Patent
Minemura et al.

(10) Patent No.: US 9,202,564 B2
(45) Date of Patent: Dec. 1, 2015

(54) SEMICONDUCTOR MEMORY DEVICE AND METHOD OF CONTROLLING DATA THEREOF

(71) Applicant: Kabushiki Kaisha Toshiba, Minato-ku (JP)

(72) Inventors: Yoichi Minemura, Yokkaichi (JP);
Takayuki Tsukamoto, Yokkaichi (JP);
Hiroshi Kanno, Yokkaichi (JP);
Takamasa Okawa, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 169 days.

(21) Appl. No.: 14/023,611

(22) Filed: Sep. 11, 2013

(65) Prior Publication Data
US 2014/0219005 A1    Aug. 7, 2014

Related U.S. Application Data (60) Provisional application No. 61/760,865, filed on Feb. 5, 2013.

(51) Int. Cl.
G11C 11/00 (2006.01)
G11C 13/00 (2006.01)

(52) U.S. Cl.
CPC .......... *G11C 13/0069* (2013.01); *G11C 13/004* (2013.01); *G11C 13/0035* (2013.01); *G11C 13/0064* (2013.01); *G11C 13/0097* (2013.01); *G11C 13/0004* (2013.01); *G11C 13/0007* (2013.01); *G11C 13/0011* (2013.01); *G11C 2013/0042* (2013.01); *G11C 2013/0054* (2013.01); *G11C 2213/71* (2013.01); *G11C 2213/72* (2013.01)

(58) Field of Classification Search
USPC ............................. 365/148, 189.011, 230.03
See application file for complete search history.

(56) References Cited

U.S. PATENT DOCUMENTS

| | | | |
|---|---|---|---|
| 6,574,129 | B1 | 6/2003 | Tran |
| 8,345,466 | B2 | 1/2013 | Maejima et al. |
| 2007/0070710 | A1 | 3/2007 | Takenaka |
| 2008/0291716 | A1* | 11/2008 | Futatsuyama et al. ........ 365/148 |
| 2010/0027317 | A1* | 2/2010 | Maejima ........................ 365/148 |

(Continued)

FOREIGN PATENT DOCUMENTS

| | | |
|---|---|---|
| JP | 2000-100184 | 4/2000 |
| JP | 2004-5950 | 1/2004 |

(Continued)

OTHER PUBLICATIONS

U.S. Appl. No. 14/305,503, filed Jun. 16, 2014, Minemura, et al.

(Continued)

*Primary Examiner* — Vu Le
(74) *Attorney, Agent, or Firm* — Oblon, McClelland, Maier & Neustadt, L.L.P.

(57) ABSTRACT

A control circuit is configured to perform a state determination operation to sense voltages of a plurality of first wiring lines, the voltages changing based on current flowing from the first wiring lines to a plurality of second wiring lines via a plurality of variable resistive elements. Then, the control circuit is configured to adjust voltages to be applied to the first and second wiring lines in a reset operation or a set operation based on the voltages of the first wiring lines sensed in the state determination operation.

20 Claims, 9 Drawing Sheets

(56) References Cited

U.S. PATENT DOCUMENTS

| | | |
|---|---|---|
| 2010/0211725 A1 | 8/2010 | Nagashima et al. |
| 2010/0315857 A1* | 12/2010 | Sonehara et al. ............ 365/148 |
| 2011/0066878 A1 | 3/2011 | Hosono et al. |
| 2013/0100726 A1 | 4/2013 | Yi et al. |
| 2013/0148400 A1 | 6/2013 | Murooka |

FOREIGN PATENT DOCUMENTS

| | | |
|---|---|---|
| JP | 2007-95131 | 4/2007 |
| JP | 2008-262613 | 10/2008 |
| JP | 2009-99200 | 5/2009 |
| JP | 2009-301691 | 12/2009 |
| JP | 2011-54259 | 3/2011 |
| JP | 2011-86365 | 4/2011 |
| JP | 2013-109796 | 6/2013 |

OTHER PUBLICATIONS

Office Action mailed Jan. 14, 2015, in co-pending U.S. Appl. No. 14/026,258.

* cited by examiner

SEMICONDUCTOR MEMORY DEVICE AND METHOD OF CONTROLLING DATA THEREOF

CROSS-REFERENCE TO RELATED APPLICATIONS

This application is based upon and claims the benefit of priority from the prior U.S. provisional Patent Application No. 61/760,865, filed on Feb. 5, 2013, the entire contents of which are incorporated herein by reference.

FIELD

Embodiments described herein relate to a semiconductor memory device and a method of controlling data thereof.

BACKGROUND

Conventionally, a memory cell is proposed that includes a variable resistive element of which resistance is changed by a voltage application. The variable resistive element can decrease its resistance by a set operation. In addition, the variable resistive element can increase its resistance by a reset operation.

The characteristics of the variable resistive element may change depending on the number of times the resistance is changed (the number of times the write/erase operations are performed).

DETAILED DESCRIPTION

A semiconductor memory device according to the embodiments described below includes a memory cell array and a control circuit. The memory cell array includes a plurality of memory cells disposed at the intersections of a plurality of first wiring lines and a plurality of second wiring lines, each memory cell comprising a variable resistive element. The control circuit is configured to perform a state determination operation to sense voltages of the first wiring lines, the voltages changing based on current flowing from the first wiring lines to the second wiring lines via a plurality of variable resistive elements. Then, the control circuit is configured to adjust the voltages to be applied to the first and second wiring lines in a reset operation or a set operation based on the voltages of the first wiring lines sensed in the state determination operation. The reset operation is an operation to increase resistance of a variable resistive element. The set operation is an operation to decrease resistance of a variable resistive element.

First Embodiment

Figure 1:
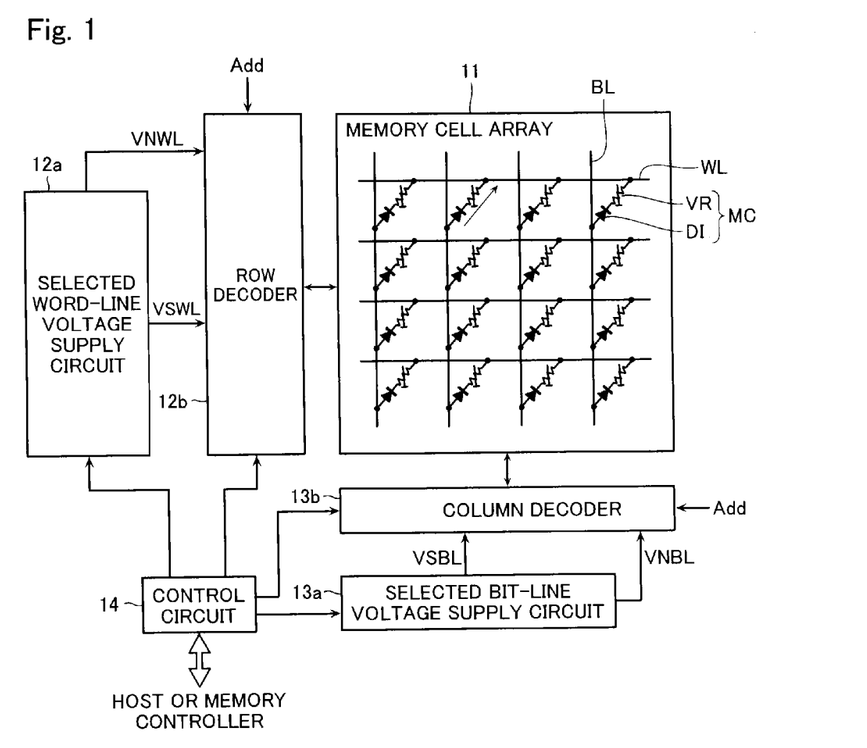
FIG. 1 is an example of a block diagram of a semiconductor memory device according to a first embodiment.

FIG. 1 is an example of a block diagram of a semiconductor memory device according to a first embodiment. With reference to FIG. 1, the semiconductor memory device according to the first embodiment includes a memory cell array 11, a selected word-line voltage supply circuit 12a, a row decoder 12b, a selected bit-line voltage supply circuit 13a, a column decoder 13b, and a control circuit 14. In addition, the semiconductor memory device operates by receiving a set or reset command and an address or the like from a host or memory controller.

The memory cell array 11 includes a plurality of word-lines WL, a plurality of bit-lines BL intersecting the word-lines WL, and a plurality of memory cells MC disposed at the intersections of the bit-lines BL and the word-lines WL. Each memory cell MC includes a diode DI and a variable resistive element VR, which are connected in series. Here, the forward direction (a direction of the flowing forward current) of the diode DI is defined as the direction from the bit-lines BL to the word-lines WL. Note that the diode DI is provided to reduce a sneak current when electrically accessed.

The selected word-line voltage supply circuit 12a supplies a selected word-line voltage VSWL to the row decoder 12b. The selected bit-line voltage supply circuit 13a supplies a selected bit-line voltage VSBL to the column decoder 13b. Each of the row decoder 12b and the column decoder 13b is given an address signal Add. In addition, according to the address signal Add, the row decoder 12b supplies the selected word-line voltage VSWL to a selected word-line WL and a non-selected word-line voltage VNWL to a non-selected word-line WL. According to the address signal Add, the column decoder 13b supplies the selected bit-line voltage VSBL to a selected bit-line BL and a non-selected bit-line voltage VNBL to a non-selected bit-line BL. Thus, the selected word-line WL and the selected bit-line BL are applied with predetermined voltages to perform a set or reset operation to the memory cell MC. The set operation is an operation to shift the variable resistive element VR in each memory cell MC from a high resistance state (reset state) to a low resistance state (set state). The reset operation is an operation to shift the variable resistive element VR from the low resistance state (set state) to the high resistance state (reset state). In this embodiment, before performing the set or reset operation, wear leveling or randomization sets the number of variable resistive elements VR in the low resistance state to be approximately equal to the number of variable resistive elements VR in the high resistance state in the memory cell array 11.

Figure 2:
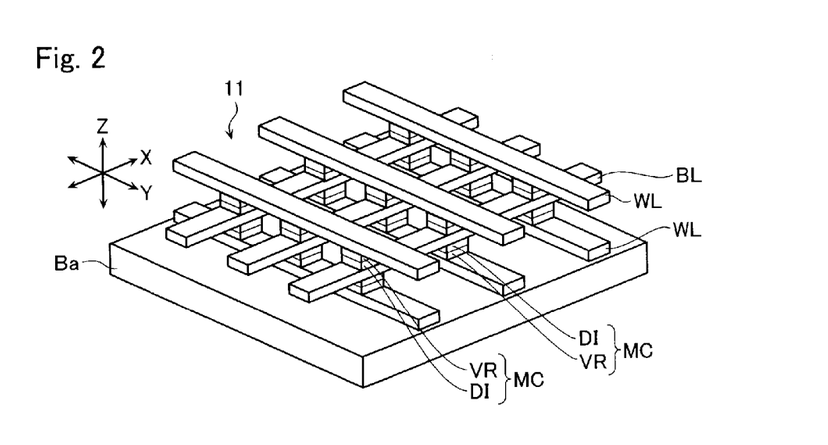
FIG. 2 is an example of a perspective view of a portion of a memory cell array 11 according to the first embodiment.

FIG. 2 is an example perspective view showing a portion of the memory cell array 11. The word-lines WL are disposed at a predetermined pitch in the X direction parallel to a semiconductor substrate Ba and extend in the Y direction. The bit-lines BL are disposed at a predetermined pitch in the Y direction to intersect the word-lines WL. The bit-lines BL extend in the X direction. The memory cells MC are connected between the word-lines WL and the bit-lines BL at the intersections of the word-lines WL and the bit-lines BL. The memory cells MC arranged in the Z direction perpendicular to the substrate Ba share a bit-line BL therebetween.

Preferably, the bit-lines BL and the word-lines WL are made of materials having heat resistance and low resistivity, such as tungsten (W), titanium (Ti), tantalum (Ta), and nitride or a stack thereof. For example, the bit-lines BL and the word-lines WL are repeated at a 40 nm pitch. In other words, the bit-lines BL and the word-lines WL have a 20 nm width and a 20 nm interval.

Each variable resistive element VR may include PCRAM, CBRAM, and ReRAM and the like as described below. The PCRAM includes a material such as chalcogenide and changes its resistance by the phase transition between the crystal state and the amorphous state of the material. The CBRAM changes its resistance by forming cross-links (contacting bridges) between electrodes via metal cation precipitation or by breaking the cross-links by ionizing the precipitated metal. The ReRAM changes its resistance by an applied voltage or current. The ReRAM includes one that changes its resistance by the presence or absence of charge trapped in a charge trap at an electrode interface, one that changes its resistance by the presence or absence of a conductive path due to oxygen defect or the like, and one that changes its resistance by the presence or absence of a conductive path due to mobile ions such as ions.

Figure 3:
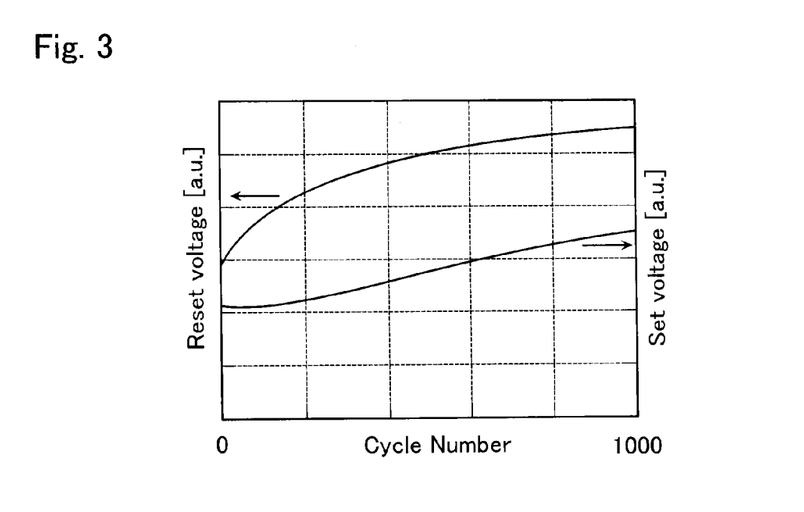
FIG. 3 illustrates an example of changes of a set voltage and a reset voltage with respect to a change of a cycle number.
Figure 4:
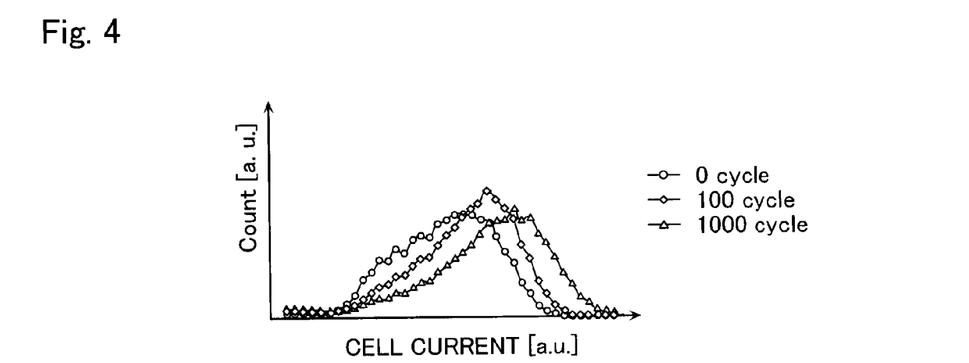
FIG. 4 illustrates an example of a change of a cell current change with respect to a change of a cycle number.

With reference now to FIG. 3 and FIG. 4, the characteristics change of the variable resistive element VR with respect to the number of times of change of the resistance (cycle number) is described. Note that in this embodiment, the cycle number is the number of set operations or the number of reset operations. In addition, in FIG. 4, the x-axis shows current flowing through a memory cell in the high resistance state from which data is read, and the y-axis shows the number of memory cells. In other words, FIG. 4 shows a current distribution through the memory cells in the memory cell array.

With reference to FIG. 3, as the cycle number increases, the reset voltage necessary for the reset operation and the set voltage for the set operation increase. In addition, with reference to FIG. 4, as the cycle number increases, the characteristics of cell current flowing through the memory cells MC (variable resistive elements VR) change. In this way, the characteristics of the variable resistive elements VR may change depending on the cycle number. Therefore, if a constant set voltage or reset voltage is always applied to the variable resistive elements VR regardless of the cycle number, the possibility of unchanged resistance of the variable resistive elements VR will be increased.

Figure 5:
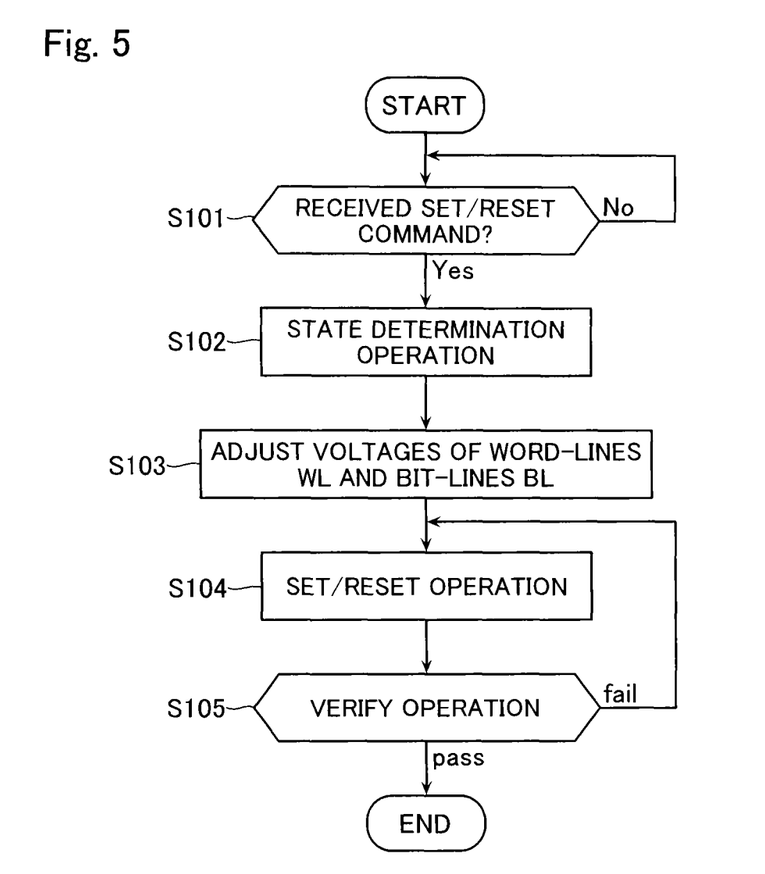
FIG. 5 is an example of a flowchart showing a set or reset operation according to the first embodiment.

Then, this embodiment performs a control shown in FIG. 5. Note that the control shown in FIG. 5 is performed by, for example, the selected word-line voltage supply circuit 12a, the row decoder 12b, the selected bit-line voltage supply circuit 13a, the column decoder 13b, and the control circuit 14. Note that the control circuit 14 is a circuit that controls, in response to an externally input command, the selected word-line voltage supply circuit 12a, the row decoder 12b, the selected bit-line voltage supply circuit 13a, and the column decoder 13b. In addition, the selected word-line voltage supply circuit 12a, the row decoder 12b, the selected bit-line voltage supply circuit 13a, the column decoder 13b, and the control circuit 14 may be collectively described as a control circuit.

With reference to FIG. 5, the control circuit first determines whether or not the semiconductor memory device has received the set or reset command (S101). If the device has not received the set or reset command (S101, No), then the control circuit repeats step S101. Meanwhile, if the device has received the set or reset command (S101, Yes), then the control circuit performs step S102.

In step S102, the control circuit performs a state determination operation that senses the voltages of the bit-lines BL, the voltages changing based on current flowing from the bit-lines BL to the word-lines WL via the variable resistive elements VR, and determines the state of the variable resistive elements VR. Then, the control circuit adjusts, according to the voltages of the bit-lines BL sensed in the state determination operation, the voltages to be applied to the word-lines WL and the bit-lines BL (S103). Then, the control circuit performs the set or reset operation using the adjusted voltages (S104). Then, the control circuit performs a verify operation (S105). The verify operation determines whether or not a memory cell MC (variable resistive element VR) are in the set or reset state. If the verify operation determines fail (S105, fail), then the control circuit performs step S104 again. If the verify operation determines pass (S105, pass), then the control circuit ends the operation. Note that when step S104 is performed again, the control circuit may change the value of the set or reset voltage or the width of the set or reset voltage.

Figure 6:
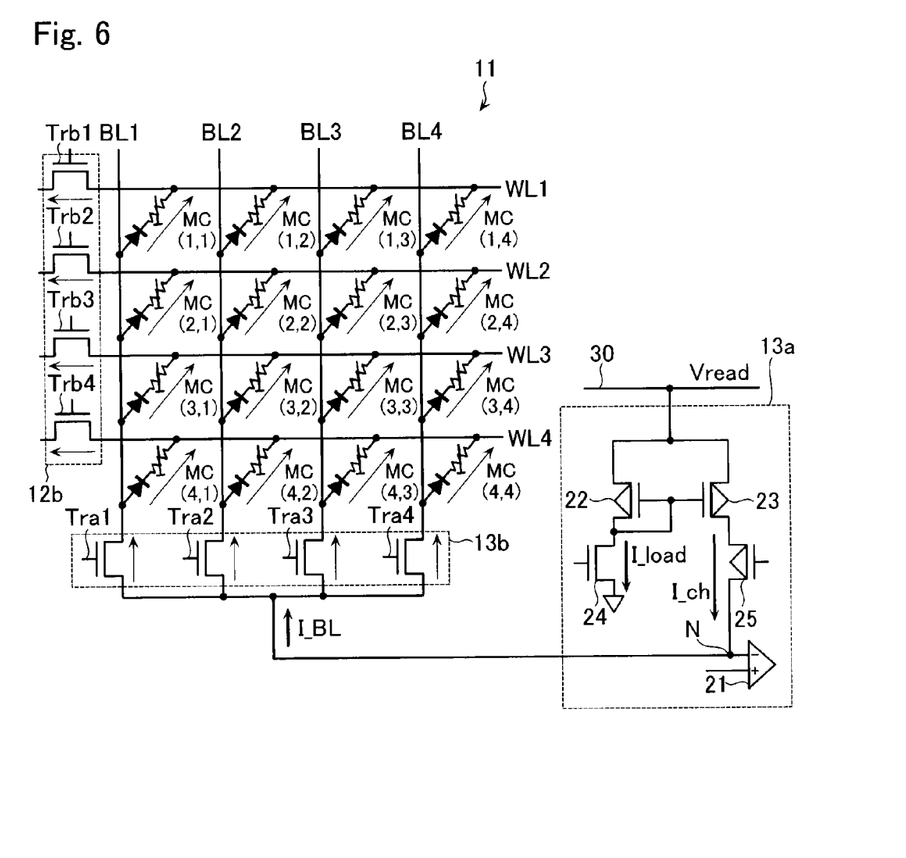
FIG. 6 illustrates an example of a selected bit-line voltage supply circuit 13a according to the first embodiment.

To perform the control shown in FIG. 5, the selected bit-line voltage supply circuit 13a has a configuration shown in FIG. 6. With reference to FIG. 6, the selected bit-line voltage supply circuit 13a is connected to a wiring line 30 and is supplied with a voltage therefrom. The selected bit-line voltage supply circuit 13a includes a sense amplifier 21 and transistors 22 to 25. The sense amplifier 21 has an inverting input terminal connected to bit-lines BL1 to BL4 via transfer transistors Tra1 to Tra4 included in the column decoder 13a. Note that one ends of the word-lines WL1 to WL4 are connected to transfer transistors Trb1 to Trb4 included in the row decoder 12b.

The PMOS transistors 22 and 23 are current-mirror connected. The PMOS transistors 22 and 23 have gates connected to the drain of the PMOS transistor 22. The PMOS transistors 22 and 23 have sources commonly connected to the wiring line 30. The NMOS transistor 24 is connected between the drain of the PMOS transistor 22 and the ground terminal. The PMOS transistor 25 is connected between the drain of the PMOS transistor 23 and the inverting input terminal (node N) of the sense amplifier 21.

With reference now to FIG. 6, the state determination operation of the selected bit-line voltage supply circuit 13a will be described. In this embodiment, the selected word-line voltage supply circuit 12a, the selected bit-line voltage supply circuit 13a, the row decoder 12b, and the column decoder 13b set, by wear leveling or the like, the number of variable resistive elements VR in the low resistance state to be approximately equal to the number of variable resistive elements VR in the high resistance state in the memory cell array 11. Therefore, as described below, the selected bit-line voltage supply circuit 13a may determine, according to current flowing from the bit-lines BL1 to BL4 to the word-lines WL1 to WL4 via memory cells MC(1, 1) to MC(4, 4), the degree of characteristic change of the variable resistive elements VR in the memory cell array 11.

The state determination operation applies a voltage Vread to the wiring line 30, and renders the transistor 25 conductive. In addition, the sense amplifier 21 has a non-inverting input terminal applied with the reference voltage (3 V). As a result, the bit-lines BL1 to BL4 are charged to, for example, 3 V. Note that along with the charging of the bit-lines BL1 to BL4, the word-lines WL1 to WL4 are charged to 3 V (not shown).

Then, the voltages of the word-lines WL1 to WL4 are decreased from 3 V to the ground voltage (0 V). The control circuit also turns the transfer transistors Tra1 to Tra4 and Trb1 to Trb4 on. Then, the control circuit adjusts the gate voltage of the transistor 24 to conduct a current I_load through the transistor 24. With the current I_load, the transistor 25 causes a current I_ch approximately equal to the current I_load to flow.

Here, the memory cells MC(1, 1) to MC(4, 4) are collectively described as a selected memory cell MCS. With the above control, this embodiment conducts the forward current through the diode DI in the state determination operation. Therefore, the current flowing from the bit-lines BL1 to BL4 to the word-lines WL1 to WL4 via the selected memory cell MCS (current flowing through the selected memory cell MCS) determines the voltage of the node N. The voltage value of the node N is sensed by, for example, the sense amplifier 21. A current I_BL flows through the bit-lines BL1 to BL4. If the current I_BL is larger than the current I_ch, the voltage of the node N decreases.

In addition, the resistance of the variable resistive elements VR may change depending on the cycle number. As a result, the current I_BL may change depending on the cycle number of the variable resistive elements VR in the selected memory cell MCS. Therefore, it may be recognized that the node N voltage changes depending on the cycle number of the selected memory cell MCS. The control circuit causes the selected bit-line voltage supply circuit 13*a* to adjust, according to the node N voltage sensed by the state determination operation, the set or reset voltage.

As described above, in the first embodiment, the control circuit senses the voltages of the bit-lines BL changing based on the current flowing from the bit-lines BL to the word-lines WL via the variable resistive elements VR, and according to the sensed voltage, the control circuit adjusts the set or reset voltage. Therefore, the first embodiment may adjust, according to the characteristics of the variable resistive element VR changing depending on the cycle number, the set or reset voltage. Thus, this embodiment may change the resistance of the variable resistive element VR correctly. In addition, in the state determination operation, the control circuit may reduce the affect of the characteristic variation of the diode DI by conducting the forward current through the diode DI.

Second Embodiment

Figure 7:
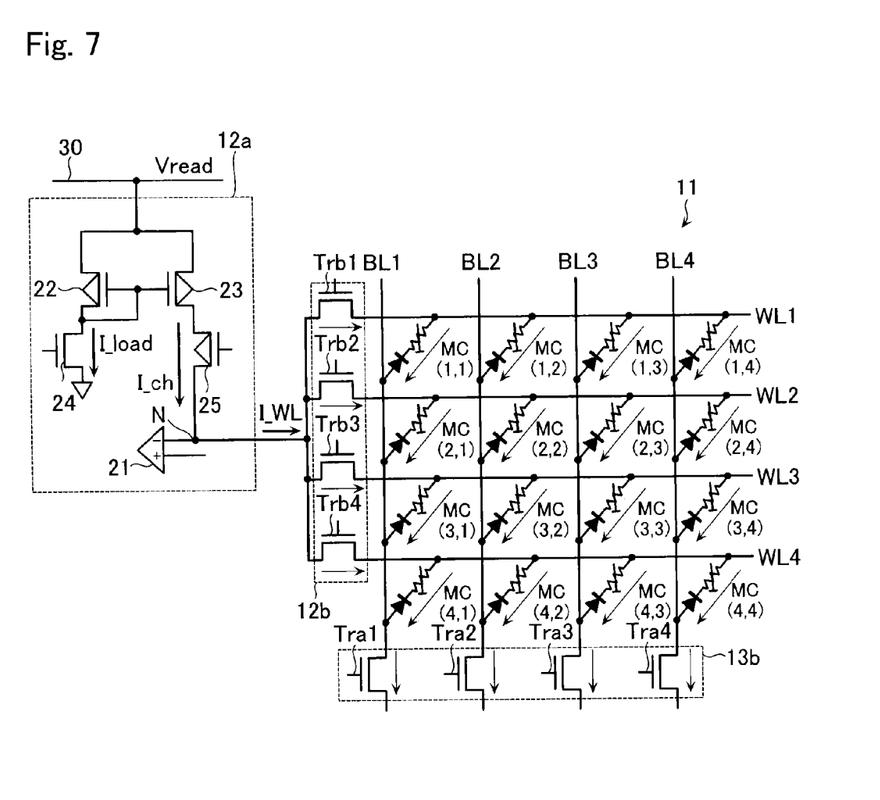
FIG. 7 is an example of a circuit diagram showing a selected word-line voltage supply circuit 12a according to a second embodiment.

With reference now to FIG. 7, a semiconductor memory device according to a second embodiment will be described. The second embodiment has the same configuration as the first embodiment except the selected word-line supply circuit 12*a*, and their description is omitted here.

The selected word-line voltage supply circuit 12*a* according to the second embodiment may have the same configuration as the selected bit-line voltage supply circuit 13*a* in the first embodiment. In the selected word-line voltage supply circuit 12*a* according to the second embodiment, the sense amplifier 21 has a non-inverting input terminal connected to the word-lines WL1 to WL4 via the transfer transistors Trb1 to Trb4.

With reference to FIG. 7, the state determination operation of the selected word-line voltage supply circuit 12*a* will be described. The state determination operation according to the second embodiment applies the voltage Vread to the wiring line 30, and turns the transistor 25 on. In addition, the non-inverting input terminal of the sense amplifier 21 is applied with the reference voltage (3 V). As a result, the word-lines WL1 to WL4 are charged to, for example, 3 V. Note that along with the charging of the word-lines WL1 to WL4, the bit-lines BL1 to BL4 are charged to 3 V (not shown).

Then, the voltages of the bit-lines BL1 to BL4 are decreased from 3 V to the ground voltage (0 V). In addition, the control circuit turns the transfer transistors Tra1 to Tra4 and Trb1 to Trb4 on. Then, the control circuit adjusts the gate voltage of the transistor 24 to cause the current I_load to flow through the transistor 24. With the current I_load, the transistor 25 conducts the current I_ch approximately equal to the current I_load.

Here, the memory cells MC(1, 1) to MC(4, 4) are collectively described as a selected memory cell MCS. With the above control, this embodiment conducts the reverse current through the diode DI in the state determination operation. Therefore, in the second embodiment, the current flowing from the word-lines WL1 to WL4 to the bit-lines BL1 to BL4 via the selected memory cell MCS (current flowing through the selected memory cell MCS) determines the voltage of the node N. A current I_WL flows through the word-lines WL1 to WL4. If the current I_WL is larger than the current I_ch, the voltage of the node N decreases. Then, the resistance of the variable resistive element VR may change depending on the cycle number. As a result, the current I_WL may change depending on the cycle number of the variable resistive elements VR in the selected memory cell MCS. Therefore, it may be recognized that the node N voltage may change depending on the cycle number of the selected memory cell MCS. Then, this embodiment controls, according to the sensed voltage of the node N, the voltages to be applied to the word-lines WL and the bit-lines BL in the set or reset operation. The second embodiment also has a similar advantage to the first embodiment. In addition, in the state determination operation, the control circuit may decrease the possibility of malfunction (an unintentional set operation and reset operation) of the memory cells by conducting the reverse current through the diode DI.

Third Embodiment

Figure 8:
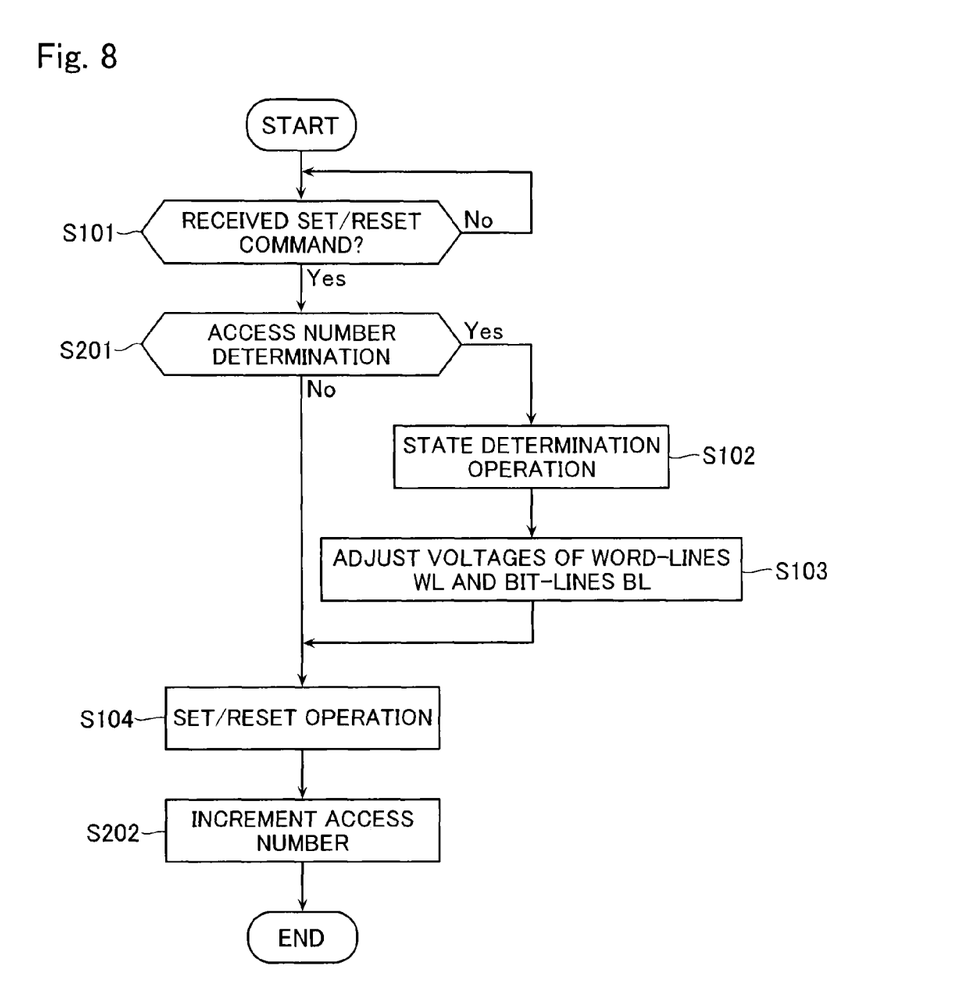
FIG. 8 is an example of a flowchart showing a set or reset operation according to a third embodiment.

With reference now to FIG. 8, a semiconductor memory device according to a third embodiment will be described. The third embodiment has the same configuration as the first embodiment, and its description is omitted here. The third embodiment has a different timing for performing the state determination operation from the first embodiment. The third embodiment performs the state determination operation when the access number (the number of times the set and reset operations are performed) reaches a predetermined number.

With reference to FIG. 8, the control circuit determines, like the first embodiment, whether or not the semiconductor memory device has received the set or reset command (S101). Here, if it is determined that the semiconductor memory device has received the set or reset command (S101, Yes), then the control circuit performs an access number determination operation to determine whether, for example, the number of accesses to the memory cell array 11 is larger than n (S201). Note that n is a natural number of two or more.

If it is determined that the number of accesses to the memory cell array 11 is larger than n (S201, Yes), then the control circuit performs steps S102 to S104 like the first embodiment. Then, the control circuit adds one to the number of accesses to the memory cell array 11 (S202).

Meanwhile, if it is determined that the number of accesses to the memory cell array 11 is smaller than n (S201, No), then the control circuit omits the processes of steps S102 and S103 and performs the processes of steps S104 and S202.

Here, the access number determination operation may be set to be performed every m×(n−1) or $m^{(n-1)}$. Note that m is a natural number of two or more.

Thus, the third embodiment also has a similar advantage to the first embodiment. In addition, this embodiment performs the state determination operation when the access number reaches a predetermined number. Therefore, this embodiment may reduce the amount of time necessary for the set or reset operation compared to the first embodiment.

Fourth Embodiment

Figure 9:
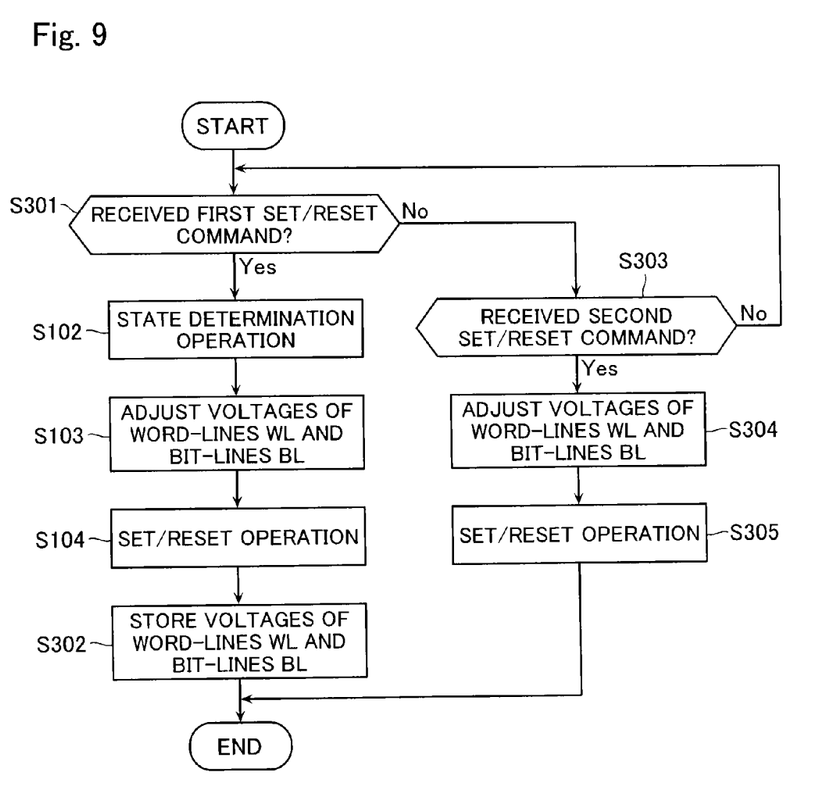
FIG. 9 is an example flowchart showing a set or reset operation according to a fourth embodiment.

With reference now to FIG. 9, a semiconductor memory device according to a fourth embodiment will be described. The fourth embodiment has the same configuration as the first embodiment, and its description is omitted here. The fourth embodiment has a different timing for performing the state determination operation from the first embodiment. The fourth embodiment receives a first set or reset command and a second set or reset command from the host or memory controller. The first set or reset command is a command to perform, like the first embodiment, the set or reset operation after the state determination operation. The second set or reset command is a command to perform the set or reset operation without performing the state determination operation.

With reference to FIG. 9, in the fourth embodiment, the control circuit determines whether or not the semiconductor memory device has received the first set or reset command from the host or memory controller (S301). Here, if it is determined that the semiconductor device has received the first set or reset command (S301, Yes), then the control circuit performs steps S101 to S104 like the first embodiment. Then, the control circuit stores the voltages of the word-lines WL and the bit-lines BL in the set or reset operation (S302).

Meanwhile, if it is determined that the semiconductor device has not received the first set or reset command (S301, No), then the control circuit determines whether or not the semiconductor device has received the second set or reset command (S303). Here, if it is determined that the semiconductor device has received the second set or reset command (S303, Yes), then the control circuit adjusts the voltages of the word-lines WL and the bit-lines BL based on the voltages stored in step S302 (S304), and performs the set or reset operation (S305).

Thus, this embodiment performs the state determination operation in response to the first set or reset command, and stores a value of the voltages applied to the word-lines WL and the bit-lines BL in the reset or set operation. Then, in response to the second set or reset command, this embodiment adjusts, according to the stored value of voltages, the voltages to be applied to the word-lines WL and the bit-lines BL in the reset or set operation. Thus, the fourth embodiment also has a similar advantage to the first embodiment. In addition, the fourth embodiment may reduce the amount of time necessary for the set or reset operation compared to the first embodiment.

Others

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 10:
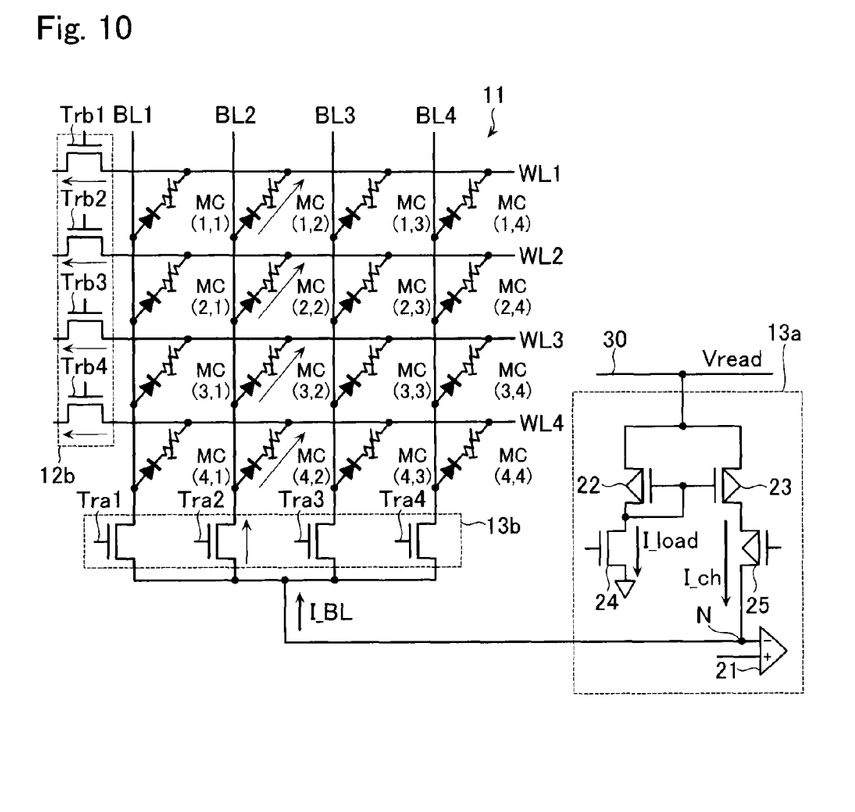
FIG. 10 is an example of a circuit diagram showing a modified example of the selected bit-line voltage supply circuit 13a according to the first embodiment.

With reference to FIG. 10, for example, the state determination operation of the selected bit-line voltage supply circuit 13a according to the first embodiment may only render the transfer transistor Tra2 conductive and render the transfer transistors Tra1, Tra3, and Tra4 non-conductive. In this case, only the current flowing from the bit-line BL2 to the word-lines WL1 to WL4 via the memory cells MC(1, 2) to MC(4, 2) determines the voltage of the node N.

Figure 11:
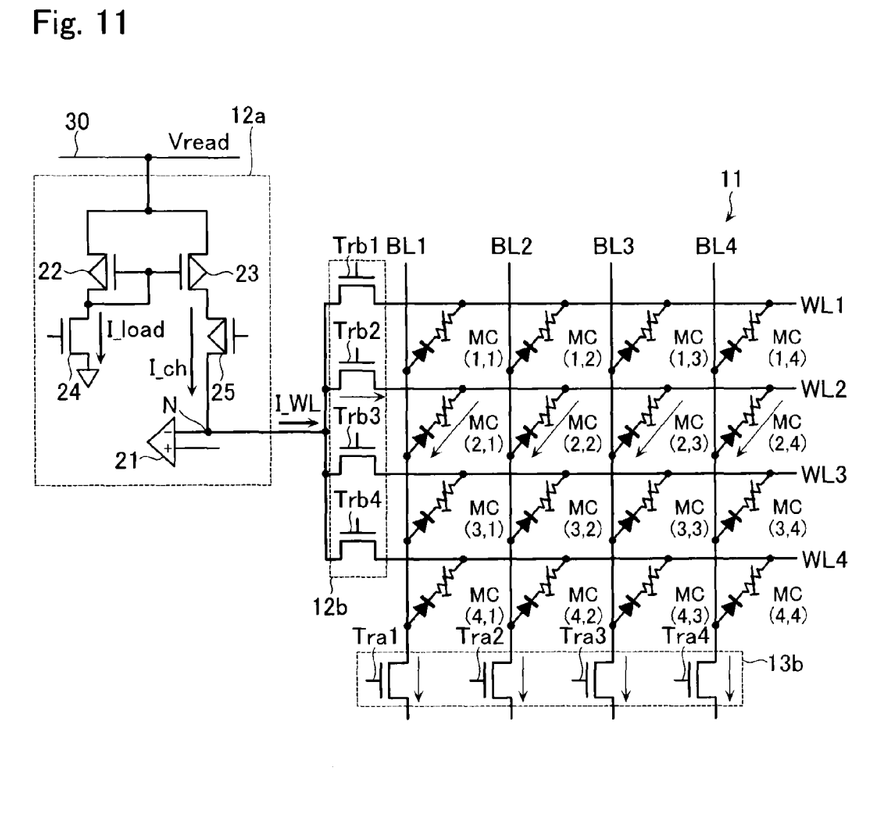
FIG. 11 is an example of a circuit diagram showing a modified example of the selected word-line voltage supply circuit 12a according to the second embodiment.

In addition, with reference to FIG. 11, the state determination operation of the selected word-line voltage supply circuit 12a according to the second embodiment may only render the transfer transistor Trb2 conductive, and render the transfer transistors Trb1, Trb3, and Trb4 non-conductive. In this case, only the current flowing from the bit-line WL2 to the bit-lines BL1 to BL4 via the memory cells MC(2, 1) to MC(2, 4) determines the voltage of the node N.

What is claimed is:

1. A semiconductor memory device comprising:
a memory cell array, the memory cell array comprising a plurality of memory cells disposed at intersections of a plurality of first wiring lines and a plurality of second wiring lines, each memory cell comprising a variable resistive element; and
a control circuit configured to perform a state determination operation of sensing a voltage of the first wiring lines, the voltage changing based on current flowing from the first wiring lines to the second wiring lines via a plurality of variable resistive elements, the control circuit being configured to adjust a voltage to be applied to the first wiring line in a reset operation or a set operation based on the voltage of the first wiring lines sensed in the state determination operation,
the reset operation being an operation to increase resistance of a variable resistive element, and
the set operation being an operation to decrease resistance of a variable resistive element.

2. The semiconductor memory device according to claim 1, wherein
each of the memory cells has a diode connected in series to the variable resistive element, and
the control circuit is configured to conduct current in the forward direction of the diode in the state determination operation.

3. The semiconductor memory device according to claim 1, wherein
each of the memory cells has a diode connected in series to the variable resistive element, and
the control circuit is configured to cause a current to flow in the reverse direction of the diode in the state determination operation.

4. The semiconductor memory device according to claim 1, wherein
in response to a first command, the control circuit performs the state determination operation, the reset operation, or the set operation.

5. The semiconductor memory device according to claim 1, wherein
the control circuit performs the state determination operation when the number of times the reset and set operations that have been performed reaches a n number (n is a natural number).

6. The semiconductor memory device according to claim 1, wherein
in response to a second command, the control circuit performs the state determination operation, and stores a value of the voltage, as first information, to be applied to the first wiring line in the reset or set operation, and in response to a third command, the control circuit adjusts, based on the first information, the voltage to be applied to the first wiring line in the reset or set operation.

7. The semiconductor memory device according to claim 1, wherein before performing the set or reset operation, the control circuit sets the number of variable resistive elements in a low resistance state in the memory cell array to be approximately equal to the number of variable resistive elements in a high resistance state.

8. The semiconductor memory device according to claim 1, wherein in the state determination operation, the control circuit is configured to increase the voltage of the first and second wiring lines to a first voltage, and then decreases the voltage of the second wiring lines to a second voltage.

9. The semiconductor memory device according to claim 1, wherein the control circuit comprises:

a sense amplifier configured to compare a voltage of a node connected to a plurality of the first wiring lines and a reference voltage; and a current mirror circuit connected to an input terminal of the sense amplifier.

10. The semiconductor memory device according to claim 9, wherein the control circuit further comprises a plurality of transistors connected between the sense amplifier and the first wiring lines.

11. The semiconductor memory device according to claim 1, wherein the first and second wiring lines extend in a direction parallel to a substrate, and memory cells arranged in a direction perpendicular to the substrate share a first wiring line.

12. A method of controlling data of a semiconductor memory device, the semiconductor memory device comprising a memory cell array, the memory cell array comprising a plurality of memory cells disposed at intersections of a plurality of first wiring lines and a plurality of second wiring lines, each memory cell comprising a variable resistive element, the method comprising:

performing a state determination operation of sensing a voltage of the first wiring lines, the voltage changing based on current flowing from the first wiring lines to the second wiring lines via a plurality of variable resistive elements; and adjusting a voltage to be applied to the first wiring line in a reset operation or a set operation based on the voltage of the first wiring lines sensed in the state determination operation, the reset operation increasing resistance of a variable resistive element, and the set operation decreasing resistance of a variable resistive element.

13. The method of controlling data of a semiconductor memory device according to claim 12, wherein each of the memory cells has a diode connected in series to the variable resistive element, and a current is caused to flow in the forward direction of the diode in the state determination operation.

14. The method of controlling data of a semiconductor memory device according to claim 12, wherein each of the memory cells has a diode connected in series to the variable resistive element, and a current is caused to flow in the reverse direction of the diode in the state determination operation.

15. The method of controlling data of a semiconductor memory device according to claim 12, wherein in response to a first command, the state determination operation, the reset operation, or the set operation is performed.

16. The method of controlling data of a semiconductor memory device according to claim 12, wherein the state determination operation is performed when the number of times the reset and set operations that have been performed reaches a predetermined number.

17. The method of controlling data of a semiconductor memory device according to claim 12, wherein in response to a second command, the state determination operation is performed, and the voltage to be applied to the first wiring line in the reset or set operation is stored as first information, and in response to a third command, the voltage to be applied to the first wiring line in the reset or set operation is adjusted based on the first information.

18. The method of controlling data of a semiconductor memory device according to claim 12, wherein the number of variable resistive elements in a low resistance state in the memory cell array is set to be approximately equal to the number of variable resistive elements in a high resistance state.

19. The method of controlling data of a semiconductor memory device according to claim 12, wherein in the state determination operation, the voltage of the first and second wiring lines is increased to a first voltage, and then the voltage of the second wiring lines is decreased to a second voltage.

20. The semiconductor memory device according to claim 1, wherein the control circuit is configured to adjust voltages to be applied to the first and second wiring lines in a reset operation or a set operation based on the voltage of the first wiring lines sensed in the state determination operation.

* * * * *